United States Patent
Udaka et al.

(10) Patent No.: US 10,032,834 B2
(45) Date of Patent: Jul. 24, 2018

(54) LIGHT RECEIVING/EMITTING ELEMENT AND LIGHT RECEIVING/EMITTING APPARATUS

(71) Applicant: SONY CORPORATION, Tokyo (JP)

(72) Inventors: Toru Udaka, Kanagawa (JP); Masaki Murata, Tokyo (JP); Rui Morimoto, Kanagawa (JP); Osamu Enoki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/418,503

(22) PCT Filed: Jun. 21, 2013

(86) PCT No.: PCT/JP2013/067053
§ 371 (c)(1),
(2) Date: Jan. 30, 2015

(87) PCT Pub. No.: WO2014/024582
PCT Pub. Date: Feb. 13, 2014

(65) Prior Publication Data
US 2015/0221706 A1    Aug. 6, 2015

(30) Foreign Application Priority Data
Aug. 9, 2012   (JP) ................................ 2012-176729

(51) Int. Cl.
*H01L 27/14*   (2006.01)
*H01L 31/0232*   (2014.01)
(Continued)

(52) U.S. Cl.
CPC ........ *H01L 27/3234* (2013.01); *H01L 27/288* (2013.01); *H01L 27/307* (2013.01); *H01L 27/322* (2013.01); *H01L 51/442* (2013.01)

(58) Field of Classification Search
CPC . H01L 27/3234; H01L 27/307; H01L 27/322; H01L 27/288; H01L 51/442
See application file for complete search history.

(56) References Cited

U.S. PATENT DOCUMENTS 6,320,325 B1 *  11/2001  Cok .................... G09G 3/3216
                                                315/169.1
2004/0031966 A1 *  2/2004  Forrest .................. H01L 27/30
                                                257/79
(Continued)

FOREIGN PATENT DOCUMENTS

JP  54-138303 A  10/1979
JP  60-111568 A   6/1985
(Continued)

OTHER PUBLICATIONS

International Search Report prepared by the Japanese Patent Office dated Sep. 10, 2013, for International Application No. PCT/JP2013/067053.

*Primary Examiner* — Su C Kim
(74) *Attorney, Agent, or Firm* — Chip Law Group

(57) ABSTRACT

Provided is a light receiving/emitting element and a light receiving/emitting apparatus that can be easily manufactured and allow high-sensitivity detection.

The light receiving/emitting element is configured to include a first organic photoelectric conversion unit and a second organic photoelectric conversion unit that is disposed on the first organic photoelectric conversion unit and is different in spectral sensitivity from the first organic photoelectric conversion unit, wherein one of the first organic photoelectric conversion unit and the second organic photoelectric conversion unit acts as a light receiving unit and the other acts
(Continued)

as a light emitting unit. The light receiving/emitting apparatus is configured to have the light receiving/emitting element mounted thereon.

8 Claims, 7 Drawing Sheets

(51) Int. Cl.
    *H01L 31/101* (2006.01)
    *H01L 27/32* (2006.01)
    *H01L 27/28* (2006.01)
    *H01L 27/30* (2006.01)
    *H01L 51/44* (2006.01)

(56) References Cited

U.S. PATENT DOCUMENTS

| | | | | |
|---|---|---|---|---|
| 2005/0280359 A1* | 12/2005 | Liu | ............... | H01L 27/3209 313/504 |
| 2007/0085070 A1* | 4/2007 | Sakata | ............... | G09G 3/3208 257/13 |
| 2009/0035677 A1* | 2/2009 | Ferrar | ............... | G03G 5/0571 430/64 |
| 2010/0181552 A1* | 7/2010 | So | ............... | H01L 27/288 257/21 |
| 2011/0019042 A1* | 1/2011 | Yamaguchi | ....... | H01L 27/14632 348/280 |
| 2012/0286296 A1* | 11/2012 | So | ............... | B82Y 10/00 257/82 |

FOREIGN PATENT DOCUMENTS

| | | |
|---|---|---|
| JP | 62-279776 A | 12/1987 |
| JP | 2004-260798 A | 9/2004 |
| JP | 2006-301864 | 11/2006 |
| JP | 2007-081203 | 3/2007 |
| JP | 2009-081296 | 4/2009 |

* cited by examiner

SHIFT IN WAVELENGTH

LIGHT RECEIVING/EMITTING ELEMENT AND LIGHT RECEIVING/EMITTING APPARATUS

CROSS REFERENCE TO RELATED APPLICATIONS

This application is a national stage application under 35 U.S.C. 371 and claims the benefit of PCT Application No. PCT/JP2013/067053 having an international filing date of Jun. 21, 2013, which designated the United States, which PCT application claimed the benefit of Japanese Patent Application No. 2012-176729 filed Aug. 9, 2012, the disclosures of both the above-identified applications are incorporated herein by reference.

TECHNICAL FIELD

The technique disclosed herein relates to a light receiving/emitting element with a light receiving function and a light emitting function and a light receiving/emitting apparatus including the light receiving/emitting element. More specifically, the technique disclosed herein relates to a light receiving/emitting element and a light receiving/emitting apparatus using organic photoelectric conversion materials.

BACKGROUND ART

Light receiving/emitting device with both a light receiving function and a light emitting function has been used in electronic information equipment such as photocopiers, facsimiles, and scanners (for example, refer to Patent Literature 1). There has been also conventionally suggested an image display device in which light emitting cells and light receiving cells are provided in pixels to detect the position of an object contacting or approaching a display screen (refer to Patent Literature 2). In the device described in Patent Literature 2, a light emitting unit is formed by an organic light emitting element and a light receiving unit is formed by a photodiode, for example.

In each of the devices described in Patent Literatures 1 and 2, the light receiving elements and the light emitting elements are arranged on one and the same plane. There is also a light receiving/emitting element in which the light receiving unit and the light emitting unit are laminated (refer to Patent Literature 3). In the information reading element described in Patent Literature 3, the light receiving unit is formed by an organic photoelectric conversion element with light permeability, and the light emitting unit is formed by an organic electroluminescence element.

There has also been suggested a light receiving/emitting element in which an organic layer is formed from an organic material having the light emitting function at the time of application of a forward bias and having the photoelectric conversion function at the time of application of a reverse bias, and which can switch between light emission and light reception by changing a bias voltage to be applied to the organic layer (refer to Patent Literature 4). The light receiving/emitting element described in Patent Literature 4 acts as a light emitting element when a forward bias is applied to the organic layer, and acts as a light receiving (imaging) element when a reverse bias is applied to the organic layer.

CITATION LIST

Patent Documents

Patent Document 1: Japanese Patent Application Laid-Open No. 2007-81203
Patent Document 2: Japanese Patent Application Laid-Open No. 2006-301864
Patent Document 3: Japanese Patent Application Laid-Open No. 2004-260798
Patent Document 4: Japanese Patent Application Laid-Open No. 2009-81296

SUMMARY OF THE INVENTION

Problems to be Solved by the Invention

However, the foregoing conventional light receiving/emitting elements and light receiving/emitting devices have problems as described below. The conventional light receiving/emitting devices in which the light receiving element and the light emitting element are arranged on one and the same plane as described in Patent Literatures 1 and 2 have a problem that the number of pixels per unit area is small and thus the detection sensitivity becomes lower. In addition, the device described in Patent Literature 2 may need a color filter for color separation at the light receiving unit, which possibly results in deteriorated light emitting property and increased complexity of a manufacturing process. Further, when the light receiving element and the light emitting element are two-dimensionally arranged at the device as described in Patent Literatures 1 and 2, crosstalk may take place between adjacent pixels.

Meanwhile, when the light receiving unit and the light emitting unit are laminated at the element as described in Patent Literature 3, the detection sensitivity of the light receiving element can be improved, but this structure may cause the light receiving unit and the light emitting unit to inhibit property each other. Further, the light receiving/emitting element described in Patent Literature 4 are used by switching between the light receiving function and the light emitting function, which causes a problem that the element cannot be used for simultaneous execution of light reception (detection) and light emission.

Accordingly, a major object of the present disclosure is to provide a light receiving/emitting element and a light receiving/emitting apparatus that can be easily manufactured and allow high-sensitivity detection.

Solutions to Problems

A light receiving/emitting element according to the present disclosure includes a first organic photoelectric conversion unit and a second organic photoelectric conversion unit that is disposed on the first organic photoelectric conversion unit and is different in spectral sensitivity from the first organic photoelectric conversion unit, and one of the first organic photoelectric conversion unit and the second organic photoelectric conversion unit acts as a light receiving unit and the other acts as a light emitting unit.

The light receiving/emitting element in the present disclosure is structured in which the light receiving unit and the light emitting unit are laminated with a high light receiving sensitivity. In addition, the light receiving unit and the light emitting unit are different in spectral sensitivity, which eliminates the need for a color filter or a lens for light dispersion.

The light receiving/emitting element in the present disclosure may be configured such that the first organic photoelectric conversion unit is disposed between a pair of electrodes and includes a first organic photoelectric conversion layer containing one or more organic semiconductor materials, the second organic photoelectric conversion unit is disposed between a pair of electrodes and includes a second organic photoelectric conversion layer containing one or more organic semiconductor materials different in spectral sensitivity from the organic semiconductor material(s) for the first organic photoelectric conversion layer, and a reverse bias voltage is applied to the first organic photoelectric conversion layer and the second organic photoelectric conversion layer.

In this case, each of the electrodes provided at the first organic photoelectric conversion unit and the second organic photoelectric conversion unit may be formed from a transparent conductive material.

The first organic photoelectric conversion layer and the second organic photoelectric conversion layer contain at least a p-type organic semiconductor material.

Further, one of the pair of electrodes provided at the first organic photoelectric conversion unit and one of the pair of electrodes provided at the second organic photoelectric conversion unit may be a common electrode.

Meanwhile, the light receiving/emitting element in the present disclosure may have a third organic photoelectric conversion unit different in spectral sensitivity from the first and second organic photoelectric conversion units, on one and the same plane as the first organic photoelectric conversion unit or the second organic photoelectric conversion unit.

The second organic photoelectric conversion unit may be configured such that three kinds of organic photoelectric conversion layers different in spectral sensitivity are provided between the pair of electrodes so as to act as a light receiving unit.

In that case, the three kinds of organic photoelectric conversion layers may be laminated.

The light receiving/emitting apparatus according to the present disclosure includes the light receiving/emitting element described above.

The light receiving/emitting apparatus according to the present disclosure uses the light receiving/emitting element in which the two kinds of organic photoelectric conversion units different in spectral sensitivity and acting as a light receiving unit or a light emitting unit are laminated, thus a high light receiving (detection) sensitivity is achieved and easy manufacture is allowed.

Effects of the Invention

According to the present disclosure, the two kinds of organic photoelectric conversion units different in spectral sensitivity are laminated, and one of them acts as a light receiving unit and the other as a light emitting unit, thereby making it possible to simplify a manufacturing process as compared to the conventional element and further improving a light receiving sensitivity.

BRIEF DESCRIPTION OF DRAWINGS

FIG. 7A is a cross-sectional view and FIGS. 7B and 7C are planar views;

MODE FOR CARRYING OUT THE INVENTION

Embodiments for carrying out the present disclosure will be described below in detail with reference to the accompanying drawings. The present disclosure is not limited to the embodiments described below. The descriptions of the embodiments will be given in the following order:
1. First Embodiment
(Example of a light receiving/emitting element in a structure which two kinds of organic photoelectric conversion units different in spectral sensitivity are laminated)
2. Modification of the First Embodiment
(Example of a light receiving/emitting element in which some of electrodes are in common at the light emitting unit and the light receiving unit)
3. Second Embodiment
(Example of a light receiving/emitting element in which a plurality of organic photoelectric conversion layers is provided at the light receiving unit)
4. Third Embodiment
(Example of a light receiving/emitting element in which the light receiving unit acts also as a color filter)
5. First Modification of the Third Embodiment
(Example of a light receiving/emitting element in which pixels in the organic photoelectric conversion layers at the light receiving unit are shifted from each other)

6. Second Modification of the Third Embodiment
(Example of a light receiving/emitting element in which the light emitting unit is provided around the light receiving unit)

1. First Embodiment

Figure 1:
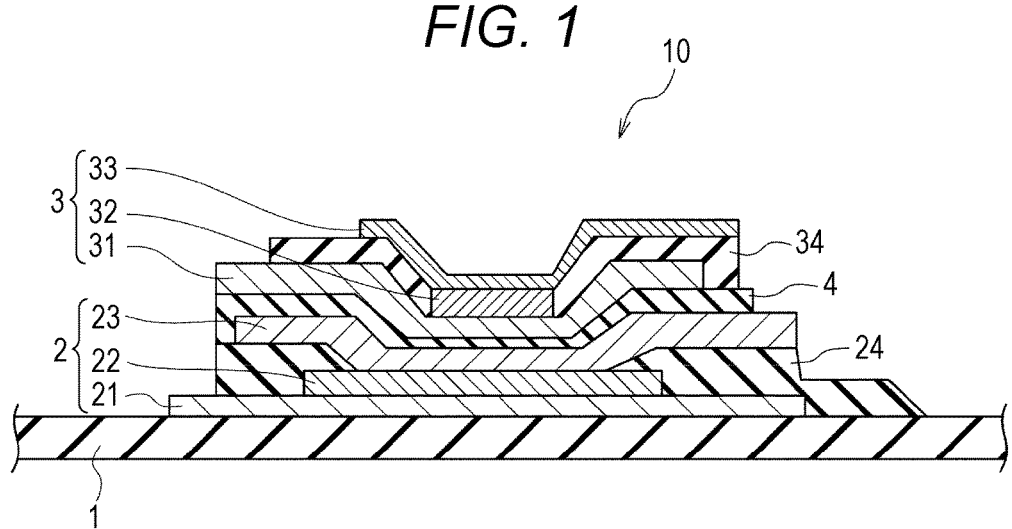
FIG. 1 is a cross-sectional schematic view of a structure of a light receiving/emitting element according to a first embodiment in the present disclosure.

First, a light receiving/emitting element according to the first embodiment of the present disclosure will be described. FIG. 1 is a cross-sectional schematic view of a structure of the light receiving/emitting element according to the embodiment. As illustrated in FIG. 1, a light receiving/emitting element 10 in the embodiment has a light emitting unit 2 placed on a substrate 1 and a light receiving unit 3 placed on the light emitting unit 2 via an insulating layer 4.

[Substrate 1]

There is no particular limitation on the material or shape of the substrate 1 as far as the substrate 1 can support the light emitting unit 2 and the light receiving unit 3. The material for the substrate 1 may be a synthetic resin such as polymethylmethacrylate (PMMA), polyvinyl alcohol (PVA), polyvinyl phenol (PVP), polyether sulfone (PES), polyimide, polycarbonate (PC), polyethylene terephthalate (PET), polyethylene naphthalate (PEN), or the like.

When the substrate 1 is formed from a synthetic resin, its shape may be plate-like, film-like, or sheet-like. In addition, the use of the substrate 1 with flexibility makes it possible to incorporate or integrate an electronic device into or with electronic equipment having a curved shape, for example.

The substrate 1 may be formed from an inorganic material such as mica, glass, or quartz. Further, the substrate 1 may be configured such that an insulating film made of silicon oxide, silicon oxynitride, aluminum oxide, metal oxide, or metallic salt is formed on a surface of any of a glass substrate, quartz substrate, silicon substrate, metal substrate, and carbon substrate.

When light emission and/or light reception are to be performed at the substrate 1 side, the substrate 1 is preferably formed from a transparent material. The "transparent material" here refers to a material that does not excessively absorb incoming light onto the light receiving unit or outgoing light from the light emitting unit, and this matter is also applicable to the subsequent description. The surface of the substrate 1 is desirably smooth but may have asperities as far as they do not affect the properties of the light emitting unit 2 and the light receiving unit 3. In addition, the surface of the substrate 1 may be subjected to a surface treatment for improving adhesiveness to the electrodes and the insulating layer formed on the surface of the substrate 1.

[Light Emitting Unit 2]

The light emitting unit 2 is composed of a pair of electrodes 21 and 23 and an organic photoelectric conversion layer 22 interposed between the electrodes 21 and 23. An insulating layer 24 is disposed on the electrode 21 in an area without the organic photoelectric conversion layer 22, which prevents occurrence of a short-circuit between the electrode 21 and the electrode 23.

The organic photoelectric conversion layer 22 may be formed from an organic semiconductor material. The organic semiconductor material here only needs to have a light emitting property, but it is desirably a p-type organic semiconductor material in particular. The organic semiconductor material constituting the organic photoelectric conversion layer 22 may be tris(8-hydroxyquinolinato)aluminum (Alq3), pigment violet 1, 3, 4, 5, 5: 1, 19, 23, 27, 29, 31, 32, 33, 34, 35, 36, 37, 38, 40, 42, 43, 44, 50, and pigment red 1, 2, 4, 5, 6, 7, 8, 9, 12, 13, 17, 21, 22, 23, 24, 31, 32, 38, 48, 49, 50, 51, 52, 53, 54, 64, 68, 88, 112, 113, 114, 122, 146, 147, 148, 149, 150, 151, 168, 170, 171, 173, 174, 175, 176, 177, 178, 179, 181, 184, 185, 190, 195, 200, 202, 206, 207, 208, 209, 214, 216, 221, 224, 225, 242, 251, 254, 255, 259, 264, 266, 268, 269, or the like.

The organic photoelectric conversion layer 22 may be formed from one kind of organic semiconductor material or may be formed from a combination of two or more kinds of organic semiconductor materials. In addition, the organic photoelectric conversion layer 22 may be formed only from a p-type organic semiconductor material or may be formed from a mixture or lamination of a p-type organic semiconductor material and an n-type organic semiconductor material.

The foregoing materials change in donor property or acceptor property depending on the combinations thereof. Accordingly, when a p-type organic semiconductor material and an n-type organic semiconductor material are to be used in mixture, the device structure is preferably designed according to a combination of the materials. Specifically, layer formation is desirably performed according to molecular HOMO (highest occupied molecular orbital)/LUMO (lowest unoccupied molecular orbital) levels.

Although there is no particular limitation, the thickness of the organic photoelectric conversion layer 22 at the light emitting unit 2 may be 50 to 500 nm, for example. This makes it possible to keep the electric field intensity within a range without excess or deficiency while preventing occurrence of a short-circuit between the electrodes.

There is no particular limitation on method for formation of the organic photoelectric conversion layer 22 but various CVD methods including application methods, PVD methods, and MOCVD methods can be applied. The application methods may be, for example, spin-coating, dipping, casting, various printing methods such as screen printing, ink-jet printing, offset printing, and gravure printing, stamping, spraying, and various coating methods such as air doctor coating, blade coating, rod coating, knife coating, squeeze coating, reverse roll coating, transfer roll coating, gravure coating, kiss coating, cast coating, spray coating, slit orifice coating, and calendar coating. As solvents, non-polar or low-polar organic solvents such as toluene, chloroform, hexane, and ethanol can be used.

The PVD methods may be vacuum evaporation methods and plasma evaporation methods using various heating techniques such as electronic beam heating, resistive heating, lamp heating, and high-frequency induction heating, various sputtering methods such as plasma vapor deposition method, bipolar sputtering, direct-current sputtering, direct-current magnetron sputtering, high-frequency sputtering, magnetron sputtering, ion beam sputtering, and bias sputtering, DC (direct current) method, RF method, multi-cathode method, activated reactive method, electric field evaporation method, and various ion plating methods such as high-frequency ion plating and reactive ion plating. In addition, when the light receiving/emitting element of the embodiment is to be integrated, pattern formation can be carried out according to the PLD method (pulse laser deposition).

The electrodes 21 and 23 can be formed from a conductive transparent material such as indium-tin oxide (including ITO, Sn-doped $In_2O_3$, crystalline ITO, and amorphous ITO), IFO (F-doped $In_2O_3$), tin oxide ($SnO_2$), ATO (Sb-doped $SnO_2$), FTO (F-doped $SnO_2$), zinc oxide (including Al-doped ZnO, B-doped ZnO, and Ga-doped ZnO), indium oxide-zinc oxide (IZO), titanium oxide ($TiO_2$), spinel-type oxide, or a $YbFe_2O_4$-structured oxide.

Meanwhile, when light enters the light receiving unit 3, the electrode 21 may be less transparent. In this case, the electrode 21 may be formed from a metallic material such as platinum (Pt), gold (Au), palladium (Pd), chrome (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo), or an alloy of these metallic elements.

The electrode 21 may also be formed from a conductive material such as a conductive particle containing the foregoing metals or alloy, polysilicon containing impurities, carbon-based material, oxide semiconductor, carbon nanotube, grapheme, and the like. In this case, the electrode 21 may be formed from mixing these conductive materials with a binder resin to form a paste or an ink and then hardening the paste-like or ink-like material. Further, the electrodes 21 and 23 may be formed from a conductive high-polymer material such as poly(3,4-ethylenedioxythiophene) or polystyrene sulfonate.

The electrodes 21 and 23 may be structured such that two or more layers formed from different materials are layered. In the configuration illustrated in FIG. 1, preferably, the electrode 21 is formed from a material with a small work function (for example, $\varphi$=3.5 eV to 4.5 eV), and the electrode 23 is formed from a material with a large work function (for example, $\varphi$=4.5 eV to 5.5 eV).

The electrode material with a small work function may be, for example, an alkali metal such as Li, Na, or K, a fluoride thereof, or an oxide thereof, an alkali earth metal such as Mg or Ca, a fluoride thereof, or an oxide thereof, aluminum (Al) or an alloy thereof, zinc (Zn) or an alloy thereof, tin (Sn) or an alloy thereof, thallium (Tl) or an alloy thereof, a sodium-potassium alloy, an aluminum-lithium alloy, a magnesium-silver alloy, a rare earth metal such as indium or ytterbium, or an alloy thereof. The material most suitable for the electrode 21 is a material containing a group 1 element or a group 2 element such as lithium, calcium, or magnesium because of they have particularly lower work functions among the foregoing materials.

In contrast, the electrode material with a large work function may be, for example, gold (Au) or an alloy thereof, silver (Ag) or an alloy thereof, chrome (Cr) or an alloy thereof, nickel (Ni) or an alloy thereof, palladium (Pd) or an alloy thereof, platinum (Pt) or an alloy thereof, iron (Fe) or an alloy thereof, iridium (Ir) or an alloy thereof, germanium (Ge) or an alloy thereof, osmium (Os) or an alloy thereof, rhenium (Re) or an alloy thereof, tellurium (Te) or an alloy thereof, or the like.

There is no particular limitation on the method for formation of the electrodes 21 and 23, and the formation method can be selected as appropriate according to the electrode materials. Specifically, the electrodes 21 and 23 may be formed by any of various physical vapor deposition (PVD) methods such as vacuum evaporation, reactive evaporation, various sputtering methods, electronic beam evaporation, and ion plating, various chemical vapor deposition (CVD) methods such as pyrosol process, thermal decomposition of an organic metallic compound, spraying, dipping, and a MOCVD method, various plating methods such as non-electrolytic plating and electrolytic plating, liftoff method, sol-gel method, electrodeposition, or shadow mask method, or a combination thereof. In addition, these techniques may be combined with patterning techniques.

The light emitting unit 2 preferably has an electron injection layer and/or an electron transport layer to facilitate injection of electrons between the organic photoelectric conversion layer 22 and the electrode 21, and has a hole injection layer and/or a hole transport layer to facilitate electrons between the organic photoelectric conversion layer 22 and the electrode 23. This improves luminous efficiency and reduces a driving voltage.

Meanwhile, the insulating layer 24 can be formed from a silicon-based insulating material such as $SiO_2$ or SiN, for example, but the insulating layer 24 is not limited to these materials but may be formed from any material capable of securing electrical insulation.

[Light Receiving Unit]

The light receiving unit 3 is composed of a pair of electrodes 31 and 33 and an organic photoelectric conversion layer 32 interposed between the electrodes 31 and 33. An insulating layer 34 is disposed on the electrode 31 in an area without the organic photoelectric conversion layer 32, and the insulating layer 34 prevents occurrence of a short-circuit between the electrode 31 and the electrode 33.

The organic photoelectric conversion layer 32 is different in spectral sensitivity from the organic photoelectric conversion layer 22 of the light emitting unit 2, and may be formed from one or more organic semiconductor materials. The organic semiconductor material here may be any material that allows conversion of light energy to electric energy. In particular, the use of a p-type organic semiconductor material is desired. Of various organic semiconductor materials, materials having reactivity with green color (about 490 to 580 nm) are: pigment violets 1, 3, 4, 5, 5:1, 19 (quinacridone), 23, 27, 29, 31, 32, 33, 34, 35, 36, 37, 38, 40, 42, 43, 44, 50, and pigment red 1, 2, 4, 5, 6, 7, 8, 9, 12, 13, 17, 21, 22, 23, 24, 31, 32, 38, 48, 49, 50, 51, 52, 53, 54, 64, 68, 88, 112, 113, 114, 122, 146, 147, 148, 149, 150, 151, 168, 170, 171, 173, 174, 175, 176, 177, 178, 179, 181, 184, 185, 190, 195, 200, 202, 206, 207, 208, 209, 214, 216, 221, 224, 225, 242, 251, 254, 255, 259, 264, 266, 268, and 269, for example.

The materials having reactivity with blue color (about 400 to 490 nm) include, for example, naphthalene derivative, anthracene derivative, naphthacene derivative, styrylamine derivative, or bis(azinyl)methene boron complex, and the like. The materials having reactivity with red color (about 580 to 700 nm) includes, for example, nile red, and pyran derivatives such as DCM1{4-(dicyanomethylene)-2-methyl-6-(4-dimethyl aminostyryl)4H-pyran} or DCJT{4-(dicyanomethylene)-2-tert-butyl-6-(julolidylstyryl)pyran}, squarylium derivative, porphyrin derivative, chlorin derivative, and Yurojirin derivative, and the like.

The organic photoelectric conversion layer 32 may be formed from a combination of two or more kinds of organic semiconductor materials, and in this case, a p-type organic semiconductor material and an n-type organic semiconductor material may be used in mixture.

Meanwhile, the electrodes 31 and 33 may be formed from aluminum or an alloy thereof, copper or an alloy thereof, titanium or an alloy thereof, tungsten or an alloy thereof, tantalum or an alloy thereof, gold or an alloy thereof, platinum or an alloy thereof, iridium or an alloy thereof, palladium or an alloy thereof, indium-tin oxide (ITO), zinc oxide, tin oxide, magnesium oxide, or the like. From the viewpoint of light reception/emission efficiency, the electrodes 31 and 33 are preferably formed from a transparent material.

The light receiving unit 3 preferably has a hole block layer formed between the organic photoelectric conversion layer 32 and the electrode 31. This makes it possible to suppress dark current. At that time, the hole block layer is preferably formed from a material with a higher ionization potential or a deeper HOMO level than the organic semiconductor material for the organic photoelectric conversion layer 32. Further, the insulating layer 34 may be formed from the same material as that for the insulating layer 24 described above.

[Insulating Layer 4]

The insulating layer 4 can be formed from a silicon-based insulating material such as $SiO_2$ or SiN, for example, but the insulating layer 4 is not limited to these materials but may be formed from any material capable of providing electrical insulation.

[Operations]

Figure 2:
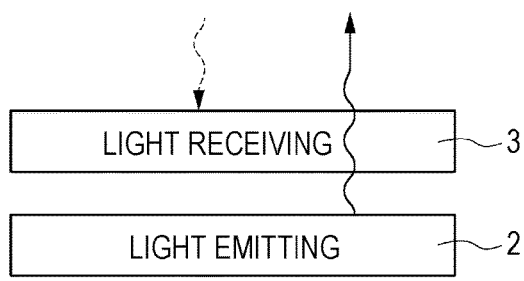
FIG. 2 is a conceptual diagram indicating operations of a light receiving/emitting element 10 illustrated in FIG. 1 in which a light receiving/emitting plane is set on a light receiving unit 3 side.
Figure 2:
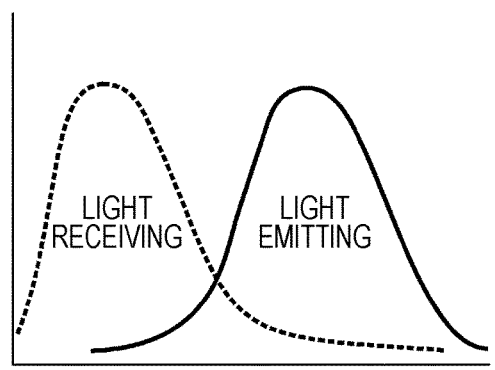
Figure 3:
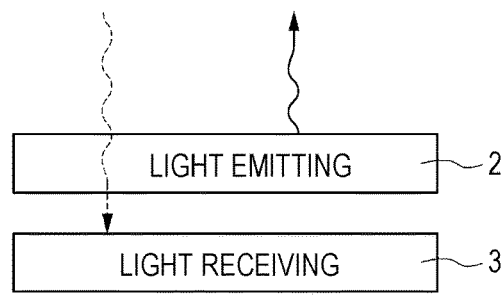
FIG. 3 is a conceptual diagram indicating operations of the light receiving/emitting element 10 illustrated in FIG. 1 in which a light receiving/emitting plane is set at a light emitting unit 2 side.
Figure 3:
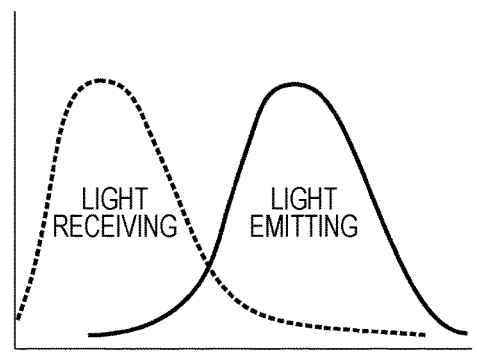

FIGS. 2 and 3 are conceptual diagrams indicating operations of the light receiving/emitting element 10 of the embodiment. FIG. 2 indicates the case where a light receiving/emitting plane is set on the light receiving unit 3 side, and FIG. 3 indicates the case where a light receiving/emitting plane is set on the light emitting unit 2 side. At the light receiving/emitting element 10 of the embodiment, a reverse bias voltage is applied to the organic photoelectric conversion layer 22 of the light emitting unit 2 and the organic photoelectric conversion layer 32 of the light receiving unit 3. Specifically, at the light emitting unit 2, a negative voltage is applied to the electrode 21 and a positive voltage is applied to the electrode 23, and at the light receiving unit 3, a positive voltage is applied to the electrode 31 and a negative voltage is applied to the electrode 33. This allows light emission at the light emitting unit 2 and allows light detection at the light receiving unit 3.

Since the light receiving/emitting element 10 of the embodiment has spectral sensitivities different between the light emitting unit 2 and the light receiving unit 3, even when the light emitting unit 2 and the light receiving unit 3 are laminated as illustrated in FIGS. 2 and 3, these units can be operated simultaneously. At the light receiving/emitting element 10, while the light emitting unit 2 and the light receiving unit 3 can be operated simultaneously, only one of them can be operated. That is, the light emitting unit 2 and the light receiving unit 3 can also be individually operated according to the use thereof. In FIGS. 2 and 3, one plane acts as a light receiving plane and a light emitting plane. Alternatively, at the light receiving/emitting element 10 of the embodiment, separate light receiving plane and light emitting plane may be provided.

Figure 4:
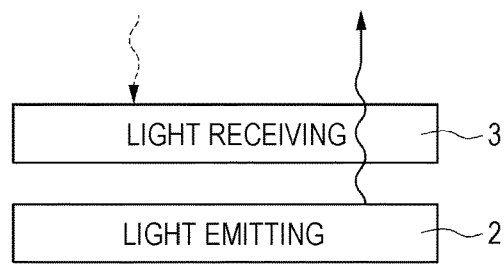
FIG. 4 is a conceptual diagram indicating another example of operations of the light receiving/emitting element 10 illustrated in FIG. 1.
Figure 4:
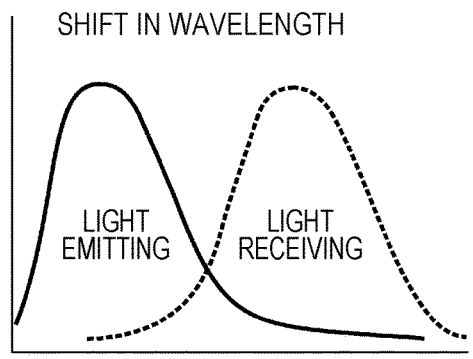

FIG. 4 is a conceptual diagram indicating another example of operations of the light receiving/emitting element 10 of the embodiment. FIGS. 2 and 3 each indicate the case where the light emitting unit 2 has a peak of spectral sensitivity on the longer wavelength side than the light receiving unit 3. However, the present disclosure is not limited to this but the light emitting unit 2 and the light receiving unit 3 only need to have peaks of spectral sensitivities shifted from each other. That is, as illustrated in FIG. 4, the light receiving unit 3 may have a peak of spectral sensitivity on the longer wavelength side than the light emitting unit 2.

The light emitting unit 2 and the light receiving unit 3 have less influence on each other as their peak positions of the spectral sensitivities are farther away from each other. It is desired that there is a difference therebetween such that they do not interfere with each other. Specifically, the spectral sensitivities of the light emitting unit 2 and the light receiving unit 3 have a difference of 100 nm or more in peak position therebetween, more preferably 200 nm or more.

Since the light receiving/emitting element 10 of the embodiment is structured such that the light emitting unit 2 and the light receiving unit 3 are laminated, it is possible to increase the detection area (number of pixels) per unit area, as compared to the structure in which the light emitting unit and the light receiving unit are arranged on one and the same plane. As a result, the light receiving/emitting element 10 of the embodiment can be improved in detection sensitivity as compared to the conventional light receiving/emitting elements.

In addition, at the light receiving/emitting element 10, the light emitting unit 2 and the light receiving unit 3 are different in spectral sensitivity and thus they can be operated simultaneously without interference properties with each other even though they are laminated. Meanwhile, at the element described in Patent Literature 3, no consideration is given to the relationship in spectral property between the light receiving unit and the light emitting unit, and thus they may affect properties with each other when they are operated simultaneously.

Further, the light receiving/emitting element 10 of the embodiment has the light emitting unit 2 and the light receiving unit 3 each composed of an organic photoelectric conversion unit using an organic semiconductor material. Accordingly, the light emitting unit 2 and the light receiving unit 3 can be formed by the same process only with the use of their dedicated metal masks. As a result, the manufacturing process can be simplified as compared to that for the conventional light receiving/emitting elements.

In the embodiment, the light receiving/emitting element 10 is configured such that the light emitting unit 2 is provided on the substrate 1 side and the light receiving unit 3 is provided on the light emitting unit 2. However, the present disclosure is not limited to this but the light emitting unit 2 and the light receiving unit 3 may be reversed in position. In that case, by applying a bias voltage in the reverse direction, the organic photoelectric conversion unit having acted as a light receiving unit can be turned to a light emitting unit and the organic photoelectric conversion unit having acted as a light emitting unit can be turned to a light receiving unit.

That is, the light receiving/emitting element of the embodiment allows switching to take place between the light receiving unit and the light emitting unit merely by changing the direction of application of a voltage. The foregoing advantages can be obtained regardless of the sequence of layering of the light emitting unit and the light receiving unit.

In addition, by mounting the light receiving/emitting element 10 of the embodiment, it is possible to realize not only an image display apparatus having the functions of object detection and imaging but also a man-machine interface for specification of an input location, for example.

2. Modification of the First Embodiment

Figure 5:
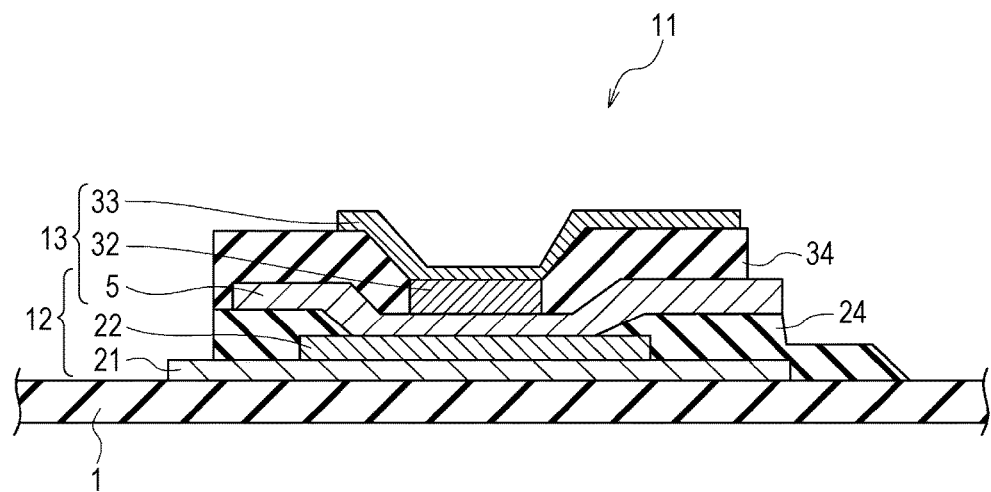
FIG. 5 is a cross-sectional schematic view of a structure of a light receiving/emitting element as a modification of the first embodiment in the present disclosure.

Next, a light receiving/emitting element according to a modification of the first embodiment of the present disclosure will be described. FIG. 5 is a cross-sectional schematic view of a structure of the light receiving/emitting element as the modification of the first embodiment in the present disclosure. In FIG. 5, the same constitutional elements of the light receiving/emitting element as those of the light receiving/emitting element 10 illustrated in FIG. 1 will be given the same reference numerals as those in FIG. 1, and descriptions thereof will be omitted.

As illustrated in FIG. 5, at a light receiving/emitting element 11 of the modification, the upper electrode of a light emitting unit 12 and the lower electrode of the light receiving unit 13 is a common electrode 5. This allows the element structure to be simplified and thinned. The configurations, operations, and advantages of the light receiving/emitting element 11 of the modification are the same as those of the first embodiment described above.

3. Second Embodiment

Figure 6:
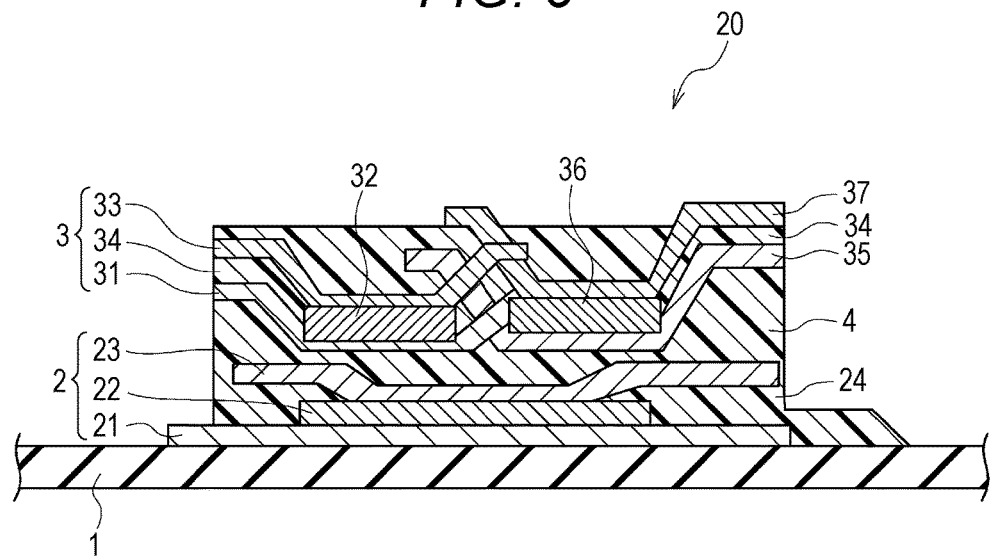
FIG. 6 is a cross-sectional schematic view of a structure of a light receiving/emitting element of a second embodiment in the present disclosure.
Figure 7:
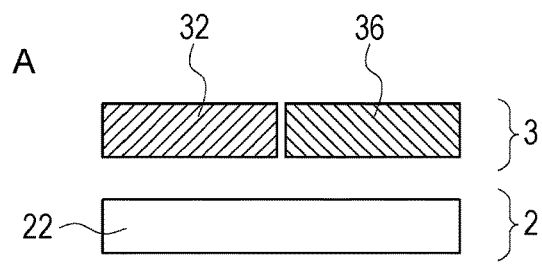
FIG. 7 includes schematic diagrams illustrating layouts of organic photoelectric conversion layers 22, 32, and 36 in a light receiving/emitting element 20 illustrated in FIG. 6.
Figure 7:
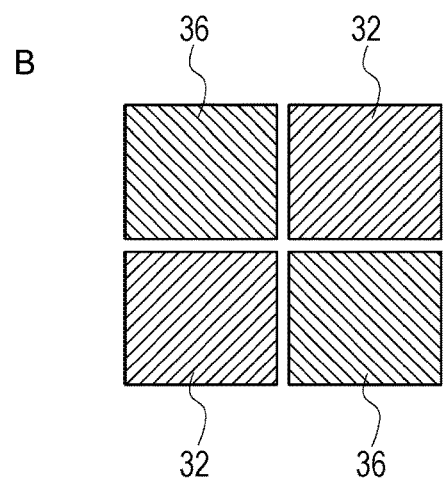
Figure 7:
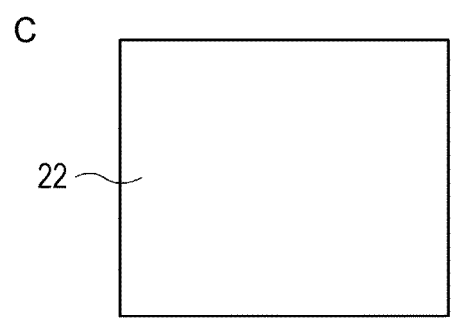

Next, a light receiving/emitting element according to a second embodiment of the present disclosure will be described. FIG. 6 is a cross-sectional schematic view of a structure of the light receiving/emitting element of the second embodiment in the present disclosure. FIG. 7 includes schematic diagrams illustrating layouts of organic photoelectric conversion layers 22, 32, and 36 in a light receiving/emitting element 20 illustrated in FIG. 6: FIG. 7A is a cross-sectional view and FIGS. 7B and 7C are planar views. In FIGS. 6 and 7, the same constitutional elements of the light receiving/emitting element as those of the light receiving/emitting element 10 illustrated in FIG. 1 will be given the same reference numerals as those in FIG. 1, and descriptions thereof will be omitted.

As illustrated in FIGS. 6 and 7, at the light receiving/emitting element 20 of the embodiment, the light receiving unit 3 has on one and the same plane thereof two kinds of organic photoelectric conversion layers 32 and 36 different in spectral sensitivity. Specifically, the light receiving unit 3 has a first organic photoelectric change unit composed of a pair of electrodes 31, 33 and the organic photoelectric conversion layer 32 therebetween and a second organic photoelectric change unit composed of a pair of electrodes 35, 37 and the organic photoelectric conversion layer 36 therebetween. An insulating layer 34 is provided to prevent occurrence of a short-circuit between the electrodes, 31, 33, 35, and 37.

There is no particular limitation on organic semiconductor materials constituting the organic photoelectric conversion layers 32 and 36. The organic semiconductor materials can be selected as appropriate according to the required detection regions (spectral sensitivities). For example, the organic photoelectric conversion layer 32 may be configured to detect red light and the organic photoelectric conversion layer 36 may be configured to detect blue light.

There is no particular limitation on the layout of the organic photoelectric conversion layers 32 and 36. The organic photoelectric conversion layers 32 and 36 may be arranged so as not to have influence on each other's light receiving property. For example, as illustrated in FIG. 7B, the organic photoelectric conversion layer 32 and the organic photoelectric conversion layer 36 may be arranged alternately.

In addition, as the light receiving/emitting element 10 of the first embodiment does, the light receiving/emitting element 20 of the embodiment may have a light receiving/emitting plane on the light receiving unit 3 side or the substrate 1 side. In either case, the light emitting unit 2 and the light receiving unit 3 can be operated simultaneously.

As described below in detail, the light receiving/emitting element 20 of the embodiment has at the light receiving unit 3 the two kinds of organic photoelectric conversion layers 32 and 36 different in spectral sensitivity, which makes it possible to prevent false colors and improve color reproducibility. The configurations, operations, and advantages other than the ones described above of the light receiving/emitting element 20 of the embodiment are the same as those of the light receiving/emitting element of the first embodiment or the modification.

4. Third Embodiment

Figure 8:
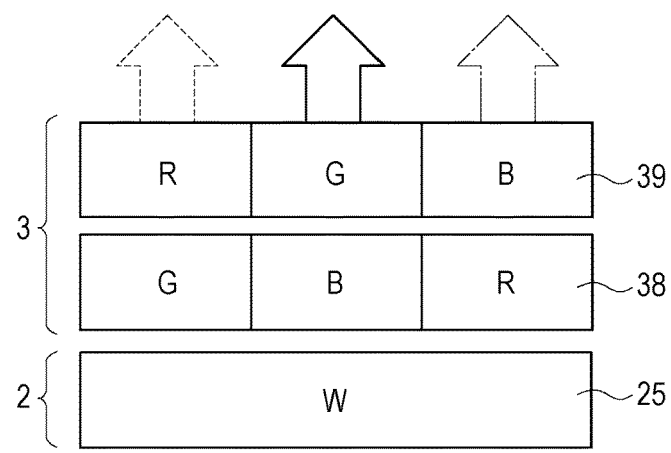
FIG. 8 is a schematic view of a configuration of a light receiving/emitting element of a third embodiment in the present disclosure.
Figure 9:
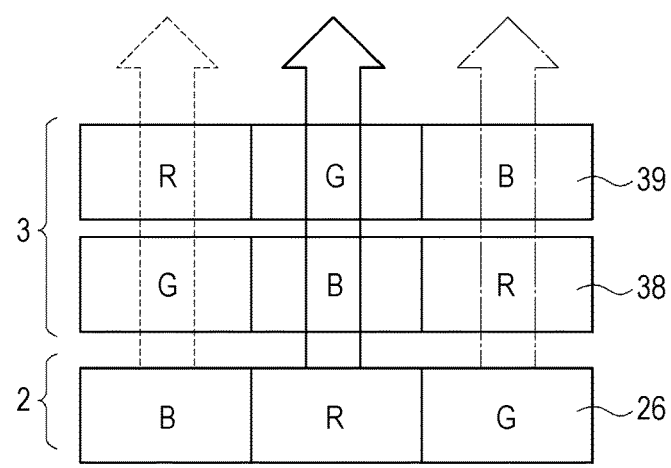
FIG. 9 is a schematic view of another configuration of a light receiving/emitting element of the third embodiment in the present disclosure.

Next, light receiving/emitting elements according to a third embodiment of the present disclosure will be described. At the light receiving/emitting elements of the embodiment, the light receiving unit 3 acts also as a color filter. FIGS. 8 and 9 are schematic views of configurations of the light receiving/emitting elements of the third embodiment in the present disclosure. In each of FIGS. 8 and 9, the same constitutional elements of the light receiving/emitting element as those of the light receiving/emitting element 10 illustrated in FIG. 1 will be given the same reference numerals as those in FIG. 1, and descriptions thereof will be omitted. FIGS. 8 and 9 do not illustrate constituent elements except the organic photoelectric conversion layers.

Specifically, as illustrated in FIG. 8, a light receiving/emitting element 30 may be configured such that an organic photoelectric conversion layer 25 emitting white light is provided on the light emitting unit 2, and two organic photoelectric conversion layers 38 and 39 including green pixels, blue pixels, and red pixels are laminated on the organic photoelectric conversion layer 25. For example, the organic photoelectric conversion layers 38 and 39 at the light receiving unit 3 are arranged such that a red pixel 39R is positioned on a green pixel 38G, a green pixel 39G is positioned on a blue pixel 38B, and a blue pixel 39B is positioned on a red pixel 38R.

Alternatively, as illustrated in FIG. 9, a light receiving element 40 may be configured such that an organic photoelectric conversion layer 26 having three kinds of pixels emitting red light, green light, and blue light is provided on the light emitting unit 2, and the two organic photoelectric conversion layers 38 and 39 are arranged on the organic photoelectric conversion layer 26. In this case, the green pixel 38G and the red pixel 39R are positioned on a blue pixel 26B of the organic photoelectric conversion layer 26, the blue pixel 38B and the green pixel 39G are positioned on a red pixel 26R of the same, and the red pixel 38R and the blue pixel 39B are positioned on a green pixel 26G of the same.

In both of the light receiving/emitting elements of the embodiment, the light receiving unit 3 acts also as a color filter, and thus there is no need to provide a separate color filter even though the organic photoelectric conversion layer 25 of the light emitting unit 2 emits white light. This makes it possible to simplify the structure and the manufacturing process. The configurations, operations, and advantages other than the ones described above of the light receiving/emitting elements in the embodiment are the same as those of the light receiving/emitting elements in the first embodiment, the modification, and the second embodiment.

5. First Modification of the Third Embodiment

Figure 10:
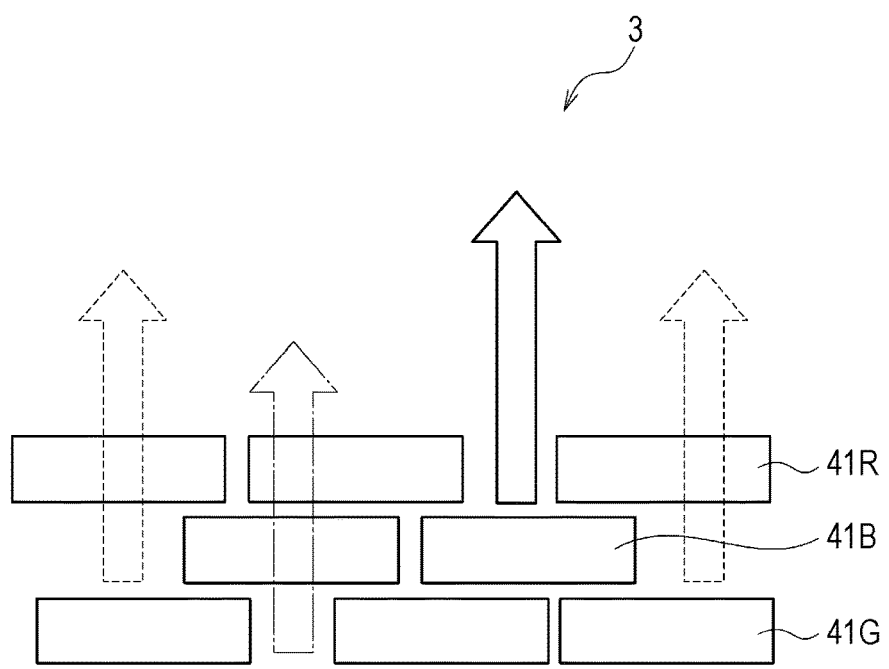
FIG. 10 is a schematic view of a configuration of a light receiving unit of a light receiving/emitting element of a first modification of the third embodiment in the present disclosure.

Next, a light receiving/emitting element according to a first modification of the third embodiment in the present disclosure will be described. FIG. 10 is a schematic view of a configuration of a light receiving unit of the light receiving/emitting element of the modification. FIG. 10 does not illustrate constituent elements except organic photoelectric conversion layers. As illustrated in FIG. 10, at the light receiving/emitting element of the modification, the light receiving unit 3 acts also as a color filter.

At the light receiving unit 3, an organic photoelectric conversion layer 41G with a plurality of green pixels, an organic photoelectric conversion layer 41B with a plurality of blue pixels, and an organic photoelectric conversion layer 41R with a plurality of red pixels are laminated via electrodes (not illustrated) and an insulating layer (not illustrated). The pixels in the organic photoelectric conversion layer 41G, the pixels in the organic photoelectric conversion layer 41B, and the pixels in the organic photoelectric conversion layer 41R are shifted from one another in the vertical direction and/or the horizontal direction.

As described above, the organic photoelectric conversion layer 41G, the organic photoelectric conversion layer 41B, and the organic photoelectric conversion layer 41R are laminated, and the pixels in these layers are shifted from one another, which makes it possible to suppress occurrence of influence such as light absorption in the upper layer. The configurations, operations, and advantages other than the ones described above of the light receiving/emitting element in the embodiment are the same as those of the light receiving/emitting element in the third embodiment.

6. Second Modification of the Third Embodiment

Figure 11:
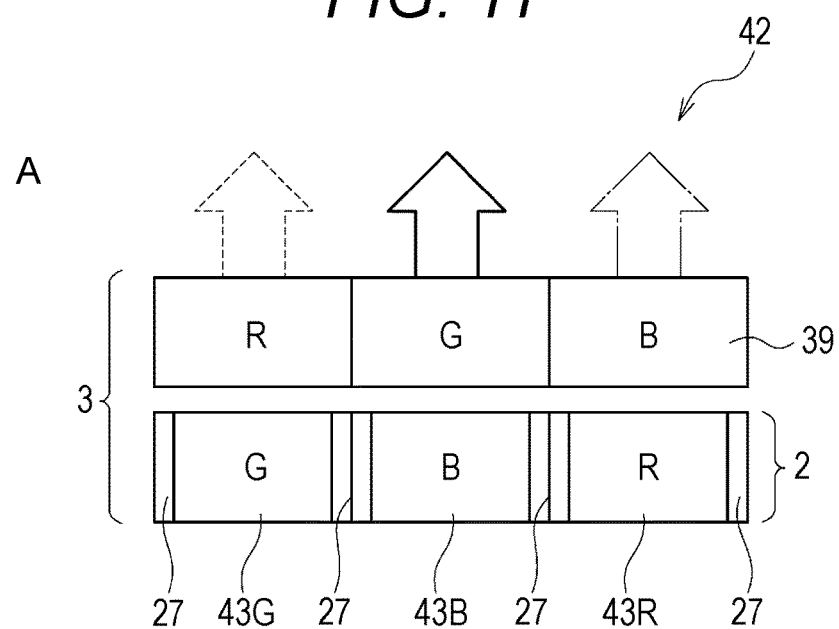
FIG. 11A is a schematic view of a configuration of a light receiving/emitting element of a second modification of the third embodiment in the present disclosure.
FIG. 11B is a planar view of a configuration of a light emitting unit of the same.
Figure 11:
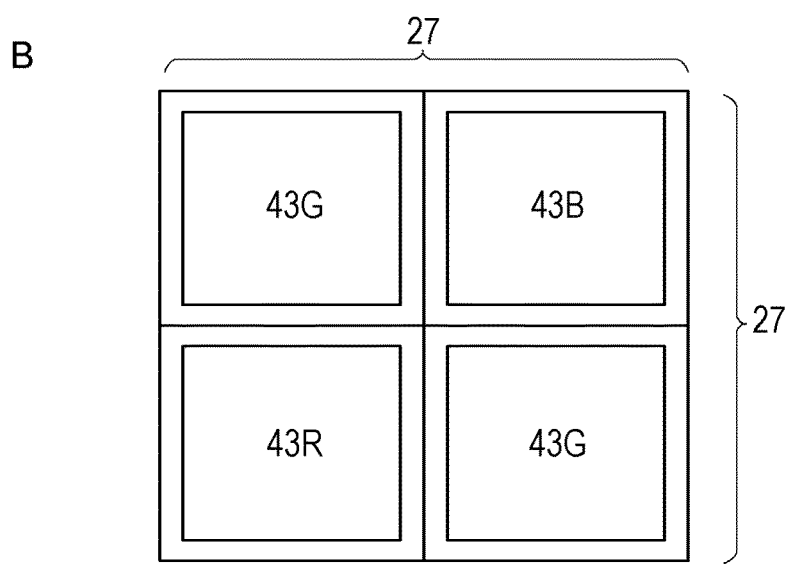

Next, a light receiving/emitting element according to a second modification of the third embodiment in the present disclosure will be described. FIG. 11A is a schematic view of a configuration of a light receiving/emitting element as the modification, and FIG. 11B is a planar view of a configuration of a light emitting unit of the same. FIG. 11 does not illustrate constituent elements except organic photoelectric conversion layers. As illustrated in FIG. 11A, at a light receiving/emitting element 42 of the modification, the light receiving unit 3 acts also as a color filter. In addition, the organic photoelectric conversion layer of the light receiving unit 3 and the organic photoelectric conversion layer 27 of the light emitting unit 2 are formed in one and the same layer.

Specifically, as illustrated in FIG. 11B, the organic photoelectric conversion layer 27 of the light emitting unit 2 is formed around pixels 43R, 43G, and 43B in the organic photoelectric conversion layer of the light receiving unit 3. This configuration eliminates the need to consider a difference in absorption between the light receiving unit 3 and the light emitting unit 2. The configurations, operations, and advantages other than the ones described above of the light receiving/emitting element in the modification are the same as those of the light receiving/emitting element in the third embodiment.

Alternatively, the present disclosure may be configured as follows:

(1)

A light receiving/emitting element including:
a first organic photoelectric conversion unit; and
a second organic photoelectric conversion unit that is disposed on the first organic photoelectric conversion unit and is different in spectral sensitivity from the first organic photoelectric conversion unit, wherein
one of the first organic photoelectric conversion unit and the second organic photoelectric conversion unit acts as a light receiving unit and the other acts as a light emitting unit.

(2)

The light receiving/emitting element according to (1), wherein
the first organic photoelectric conversion unit includes a first organic photoelectric conversion layer that is interposed between a pair of electrodes and contains one or more organic semiconductor materials,
the second organic photoelectric conversion unit includes a second organic photoelectric conversion layer that is interposed between a pair of electrodes and contains one or more organic semiconductor materials different in spectral sensitivity from the organic semiconductor material constituting the organic photoelectric conversion layer, and a reverse bias voltage is applied to the first organic photoelectric conversion layer and the second organic photoelectric conversion layer.

(3)

The light receiving/emitting element according to (2), wherein each of the electrodes at the first organic photoelectric conversion unit and the second organic photoelectric conversion unit are formed from a transparent conductive material.

(4)

The light receiving/emitting element according to (2) or (3), wherein the first organic photoelectric conversion layer and the second organic photoelectric conversion layer contain at least a p-type organic semiconductor material.

(5)

The light receiving/emitting element according to any of (2) to (4), wherein one of the pair of electrodes at the first organic photoelectric conversion unit and one of the pair of electrodes at the second organic photoelectric conversion unit is a common electrode.

(6)

The light receiving/emitting element according to any of (1) to (5), wherein a third organic photoelectric conversion unit different in spectral sensitivity from the first and second organic photoelectric conversion units is provided on one and the same plane as the first organic photoelectric conversion unit or the second organic photoelectric conversion unit.

(7)

The light receiving/emitting element according to any of (1) to (6), wherein the second organic photoelectric conversion unit has three kinds of organic photoelectric conversion layers different in spectral sensitivity interposed between the pair of electrodes, the organic photoelectric conversion layers acting as a light receiving unit.

(8)

The light receiving/emitting element according to (7), wherein the three kinds of organic photoelectric conversion layers are laminated.

(9)

A light receiving/emitting apparatus including the light receiving/emitting element according to any of (1) to (8).

REFERENCE SIGNS LIST

1 Substrate
2, 12 Light emitting unit
3, 13 Light receiving unit
4, 24, 34 Insulating layer
5 Common electrode
10, 11, 20, 30, 40, 42 Light receiving/emitting element
21, 23, 31, 33, 35, 37 Electrode
22, 25, 26, 27, 32, 36, 38, 39, 41R, 41G, 41B, 43R, 43G, 43B Organic photoelectric conversion layer

What is claimed is:
1. A photoelectric device, comprising:
a first organic photoelectric conversion unit, comprising:
a first electrode;
a second electrode; and
a first organic photoelectric conversion layer between the first electrode and the second electrode; and a second organic photoelectric conversion unit on the first organic photoelectric conversion unit, wherein the second organic photoelectric conversion unit comprises:
a third electrode;
a fourth electrode;
a second organic photoelectric conversion layer between the third electrode and the fourth electrode; and
a third organic photoelectric conversion layer,
wherein the second organic photoelectric conversion layer is adjacent and in contact with the third organic photoelectric conversion layer, and the second organic photoelectric conversion layer and the third organic photoelectric conversion layer are in a same plane,
wherein the second organic photoelectric conversion layer and the third organic photoelectric conversion layer are on the first organic photoelectric conversion layer,
wherein the first organic photoelectric conversion layer has a first spectral sensitivity, and the second organic photoelectric conversion layer has a second spectral sensitivity different from the first spectral sensitivity, and the third organic photoelectric conversion layer has a third spectral sensitivity different from the first spectral sensitivity and the second spectral sensitivity, and
wherein one of the first organic photoelectric conversion unit or the second organic photoelectric conversion unit is configured to receive light and other of the first organic photoelectric conversion unit or the second organic photoelectric conversion unit is configured to emit light.

2. The photoelectric device according to claim 1,
wherein the first organic photoelectric conversion layer comprises a first organic semiconductor material,
wherein the second organic photoelectric conversion layer comprises a second organic semiconductor material different in spectral sensitivity from the first organic semiconductor material, and
wherein a reverse bias voltage is applied to the first organic photoelectric conversion layer and the second organic photoelectric conversion layer.

3. The photoelectric device according to claim 1, wherein the first electrode, the second electrode, the third electrode, and the fourth electrode comprise a transparent conductive material.

4. The photoelectric device according to claim 1, wherein the first organic photoelectric conversion layer and the second organic photoelectric conversion layer comprise a p-type organic semiconductor material.

5. The photoelectric device according to claim 1, wherein one of the first electrode or the second electrode at the first organic photoelectric conversion unit and one of the third electrode or the fourth electrode at the second organic photoelectric conversion unit is a common electrode.

6. The photoelectric device according to claim 5, wherein the second organic photoelectric conversion unit further includes:
a fifth electrode; and
a sixth electrode;
wherein the third organic photoelectric conversion layer is between the fifth electrode and the sixth electrode.

7. The photoelectric device according to claim 6,
wherein the second organic photoelectric conversion unit further includes an insulating layer configured to prevent an occurrence of a short circuit between the third electrode, the fourth electrode, the fifth electrode and the sixth electrode, and
wherein the second organic photoelectric conversion unit is configured to receive the light.

8. A photoelectric device, comprising:
a light receiving/emitting element, comprising:
a first organic photoelectric conversion unit, comprising:
a first electrode;
a second electrode; and
a first organic photoelectric conversion layer between the first electrode and the second electrode; and
a second organic photoelectric conversion unit on the first organic photoelectric conversion unit, wherein the second organic photoelectric conversion unit comprises:
a third electrode;
a fourth electrode;
a second organic photoelectric conversion layer between the third electrode and the fourth electrode; and
a third organic photoelectric conversion layer,
wherein the second organic photoelectric conversion layer is adjacent and in contact with the third organic photoelectric conversion layer, and the second organic photoelectric conversion layer and the third organic photoelectric conversion layer are in a same plane,
wherein the second organic photoelectric conversion layer and the third organic photoelectric conversion layer are on the first organic photoelectric conversion layer,
wherein the first organic photoelectric conversion layer has a first spectral sensitivity, and the second organic photoelectric conversion layer has a second spectral sensitivity different from the first spectral sensitivity, and the third organic photoelectric conversion layer has a third spectral sensitivity different from the first spectral sensitivity and the second spectral sensitivity, and
wherein one of the first organic photoelectric conversion unit or the second organic photoelectric conversion unit is configured to receive light and other of the first organic photoelectric conversion unit or the second organic photoelectric conversion unit is configured to emit light.

* * * * *